(12) United States Patent
Ohtani

(10) Patent No.: US 6,891,760 B2
(45) Date of Patent: May 10, 2005

(54) METHOD OF ERASING INFORMATION IN NON-VOLATILE SEMICONDUCTOR MEMORY DEVICE

(75) Inventor: Jun Ohtani, Hyogo (JP)

(73) Assignee: Renesas Technology Corp., Tokyo (JP)

(*) Notice: Subject to any disclaimer, the term of this patent is extended or adjusted under 35 U.S.C. 154(b) by 253 days.

(21) Appl. No.: 10/278,895

(22) Filed: Oct. 24, 2002

(65) Prior Publication Data
US 2003/0223273 A1 Dec. 4, 2003

(30) Foreign Application Priority Data
Jun. 3, 2002 (JP) ....................................... 2002-161081

(51) Int. Cl.$^7$ .............................................. G11C 16/04
(52) U.S. Cl. .................................. 365/185.29; 365/218
(58) Field of Search ..................... 365/185.29, 185.14, 365/218, 138

(56) References Cited

U.S. PATENT DOCUMENTS 6,469,343 B1 * 10/2002 Miura et al. ................ 257/324
6,596,590 B1 * 7/2003 Miura et al. ................ 438/261
6,649,542 B2 * 11/2003 Miura et al. ................ 438/791

FOREIGN PATENT DOCUMENTS

| JP | 2001-110918 | 4/2001 |
|---|---|---|
| JP | 2001-156272 | 6/2001 |

* cited by examiner

*Primary Examiner*—Thong Q. Le
(74) *Attorney, Agent, or Firm*—Burns, Doane, Swecker & Mathis, L.L.P.

(57) ABSTRACT

A potential of −3V is applied to a control gate electrode, a potential of 5V is applied to a pair of impurity regions and a potential of 3V is applied to a semiconductor substrate in a non-volatile semiconductor memory device. Accordingly, electrons existing on one impurity region side in a silicon nitride film move toward that impurity region, and electrons existing on the other impurity region side move toward that impurity region. Furthermore, electrons existing in that part (middle part) of the silicon nitride film which is positioned immediately above a region approximately at the middle point between one impurity region and the other impurity region move toward the semiconductor substrate. Therefore, MPE (Miss Placed Electron) is no longer caused in the non-volatile semiconductor memory device.

5 Claims, 15 Drawing Sheets

METHOD OF ERASING INFORMATION IN NON-VOLATILE SEMICONDUCTOR MEMORY DEVICE

BACKGROUND OF THE INVENTION

1. Field of the Invention

The present invention relates to a method of erasing information in a non-volatile semiconductor memory device. More particularly, the present invention relates to a method of erasing information in a non-volatile semiconductor memory device including a memory cell having a stacked film formed of an oxide film, a nitride film and an oxide film (abbreviated as "ONO film" hereinafter).

2. Description of the Background Art

An MONOS (Metal OxyNitride Oxide Semiconductor) type non-volatile semiconductor memory device as one type of non-volatile semiconductor memory devices includes a so-called NROM (Nitrided Read Only Memory) 120 capable of handling two-bit information in one cell 110 as shown in FIG. 17.

In an individual cell, for example as shown in FIG. 18, an ONO film 105 formed of silicon oxide films 105a, 105c and silicon nitride film 105b has a floating gate structure. Of three films constituting ONO film 105, silicon nitride film 105b serves as a floating gate.

A pair of impurity regions 103a and 103b serving as a source/drain region are formed in one region and other region of a semiconductor substrate 101 with ONO film 105 interposed therebetween. A control gate electrode 107 of a polysilicon film or of a polycide structure is formed on ONO film 105.

Information is written by injecting channel hot electrons (simply referred to as "electron" hereinafter) into two separate portions, that is, a portion positioned on the side of one impurity region 103a and a portion positioned on the side of the other impurity region 103b, of, a pair of impurity regions 103a and 103b, respectively, in silicon nitride film 105b. Two-bit information can thereby be handled in one cell.

As an operation of erasing information written by injecting electrons, an operation of erasing information written in only one bit of two bits will now be described.

FIG. 18 shows electrons 111 as information injected into the portion positioned on the one impurity region 103a side in silicon nitride film 105b. In this state, a potential of 0V is applied to control gate electrode 107 and the pair of impurity regions 103a and 103b, respectively.

Then, as shown in FIG. 19, a potential of 8V is applied to one impurity region 103a, and the other impurity region 103b is brought into a floating state. Therefore electrons 111 in silicon nitride film 105b are pulled off toward one impurity region 103a as indicated by arrow 115.

Furthermore, as shown in FIG. 21, when electrons 111 are injected into the portion positioned on the other impurity region 103b side in silicon nitride film 105b, the erasing operation is also performed in a manner similar to the erasing operation as described above.

In this case, as shown in FIG. 22, a potential of 8V is applied to the other impurity region 103b while one impurity region 103a is brought into a floating state, so that electrons 111 in silicon nitride film 105b are pulled off toward the other impurity region 103b as indicated by arrow 115.

As the operation of erasing information written by injecting electrons, the operation of erasing information written in both two bits as shown in FIG. 24 at one time will now be described.

In this case, as shown in FIG. 25, a potential of 5V is applied to one impurity region 103a and the other impurity region 103b, respectively, while a potential of −3V is applied to control gate electrode 107.

Therefore, electrons 111 located on the one impurity region 103a side in silicon nitride film 105b is pulled off toward one impurity region 103a as indicated by arrow 115, and electrons 111 located on the other impurity region 103b side are pulled off toward the other impurity region 103b as indicated by arrow 115. In this manner, the operation of erasing information is performed in NROM 120.

The aforementioned erasing operation in NROM 120, however, has the following problems. In writing information, as shown in FIGS. 18, 21 or 24, electrons 111a may be trapped accidentally in that part of silicon nitride film 105b which is positioned immediately above a region approximately at the midpoint between one impurity region 103a and the other impurity region 103b.

These electrons 111a are not pulled off in the erasing operations respectively shown in FIGS. 19, 22 and 25 as described above and still remain in silicon nitride film 105b even after the erasing operation as shown in FIGS. 20, 23 and 26, respectively. Therefore, electrons 111a are accumulated in silicon nitride film 105b after the erasing operation, resulting in variations of threshold voltages in cell 110. It is noted that electrons 111a remaining in silicon nitride film 105b are referred to as "MPE" (Miss Placed Electrons), in particular.

SUMMARY OF THE INVENTION

The present invention is made to solve the above problem and an object of the present invention is to provide a method of erasing information in a non-volatile semiconductor memory device without causing MPE.

In a first method of erasing information in a non-volatile semiconductor memory device in accordance with the present invention, the non-volatile semiconductor memory device includes a pair of impurity regions formed spaced apart from each other on a main surface of a semiconductor substrate, an insulating film including a charge accumulation layer formed on that region on the semiconductor substrate which is sandwiched between the pair of impurity regions for accumulating charges, and an electrode portion formed on the insulating film for controlling movement of charges for the charge accumulation layer. Erasing information is performed by applying a prescribed potential for simultaneously pulling off charges accumulated in the charge accumulation layer in three directions toward both of the pair of impurity regions and the semiconductor substrate, to the semiconductor substrate, the pair of impurity regions and the electrode portion, respectively.

In accordance with this erasing method, those charges of the charges accumulated in the charge accumulation layer which exist on the side of one impurity region of the pair of impurity regions are pulled off toward the one impurity region. Those charges which exist on the side of the other impurity region of the pair of impurity regions are pulled off toward the other impurity region. Those charges which exist in that part (middle part) of the charge accumulation layer which is positioned immediately above a region approximately at the middle point between one impurity region and the other impurity region are pulled off toward the semiconductor substrate. Accordingly as compared with the conventional erasing method, it is ensured that the electrons existing in the middle part of the charge accumulation layer are pulled off, so that all the electrons accumulated in the charge accumulation layer are pulled off. As a result, it is possible to prevent threshold variations resulting from the electrons existing in the middle part of the charge accumulation layer.

In a second method of erasing information in a non-volatile semiconductor memory device in accordance with the present invention, the non-volatile semiconductor memory device includes a pair of impurity regions formed spaced apart from each other on a main surface of a semiconductor substrate, an insulating film including a charge accumulation layer formed on that region of the semiconductor substrate which is sandwiched between the pair of impurity regions for accumulating charges, and an electrode portion formed on the insulating film for controlling movement of charges for the charge accumulation layer. The erasing is performed by applying a prescribed potential for pulling off charges accumulated in the charge accumulation layer toward the electrode portion, to the semiconductor substrate, the pair of impurity regions and the electrode portion, respectively.

In accordance with this erasing method, charges existing in the middle of the charge accumulation layer and charges existing on the respective sides of the pair of impurity regions are pulled off from the charge accumulation layer toward the electrode portion simultaneously in a single erasing operation. As a result, charges are no longer accumulated in the charge accumulation layer after the erasing operation, so that threshold voltage variations can be prevented.

Preferably, the prescribed potential is applied in a state in which charges corresponding to two bits are accumulated in the charge accumulation layer.

Therefore any inconvenience caused by over-erasing can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
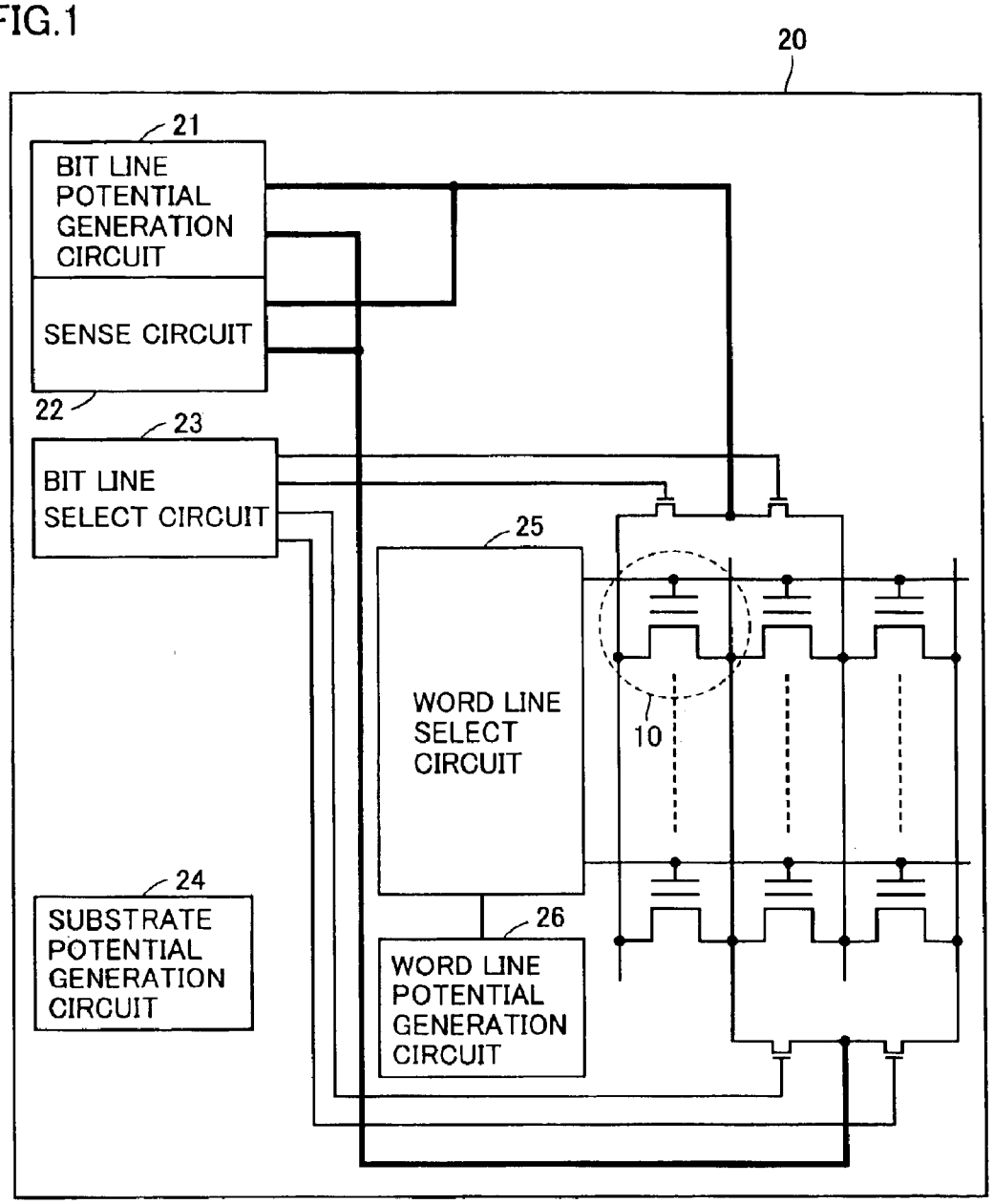
FIG. 1 is a block diagram showing a configuration of a non-volatile semiconductor memory device to which a method of erasing in a non-volatile semiconductor memory device in accordance with a first embodiment of the present invention is applied.
Figure 2:
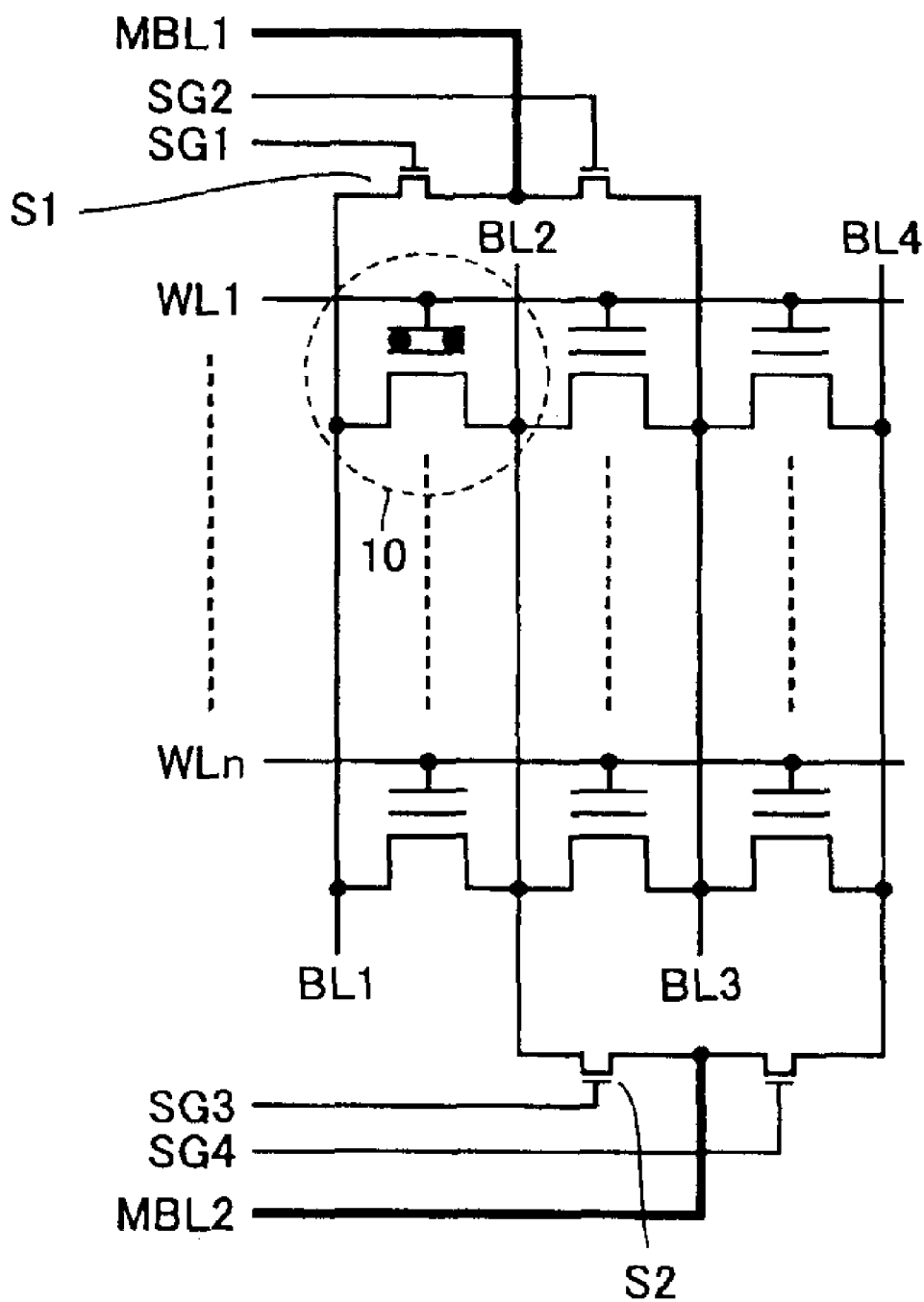
FIG. 2 is a block diagram of the partially enlarged non-volatile semiconductor memory device shown in FIG. 1 in the first embodiment.

A non-volatile semiconductor memory device and an erasing operation thereof in accordance with a first embodiment of the present invention will now be described. First, the configuration of the non-volatile semiconductor memory device will be described. As shown in FIGS. 1 and 2, a prescribe circuit is provided for writing, reading and erasing information for each cell in a non-volatile semiconductor memory device 20.

A bit line potential generation circuit 21 generates a potential necessary for writing, reading and erasing, respectively. A bit line select circuit 23 controls a connection of bit line potential generation circuit 21 with two bit lines of a selected cell for the selected cell.

A sense circuit 22 detects current flowing in a bit line in reading data in the selected cell. A word line potential generation circuit 26 generates the respective potentials for writing, reading and erasing. A word line select circuit 25 applies a prescribed potential generated in word line potential generation circuit 26 to the word line of the selected cell. A substrate potential generation circuit 24 generates a potential to be applied to the substrate.

Figure 3:
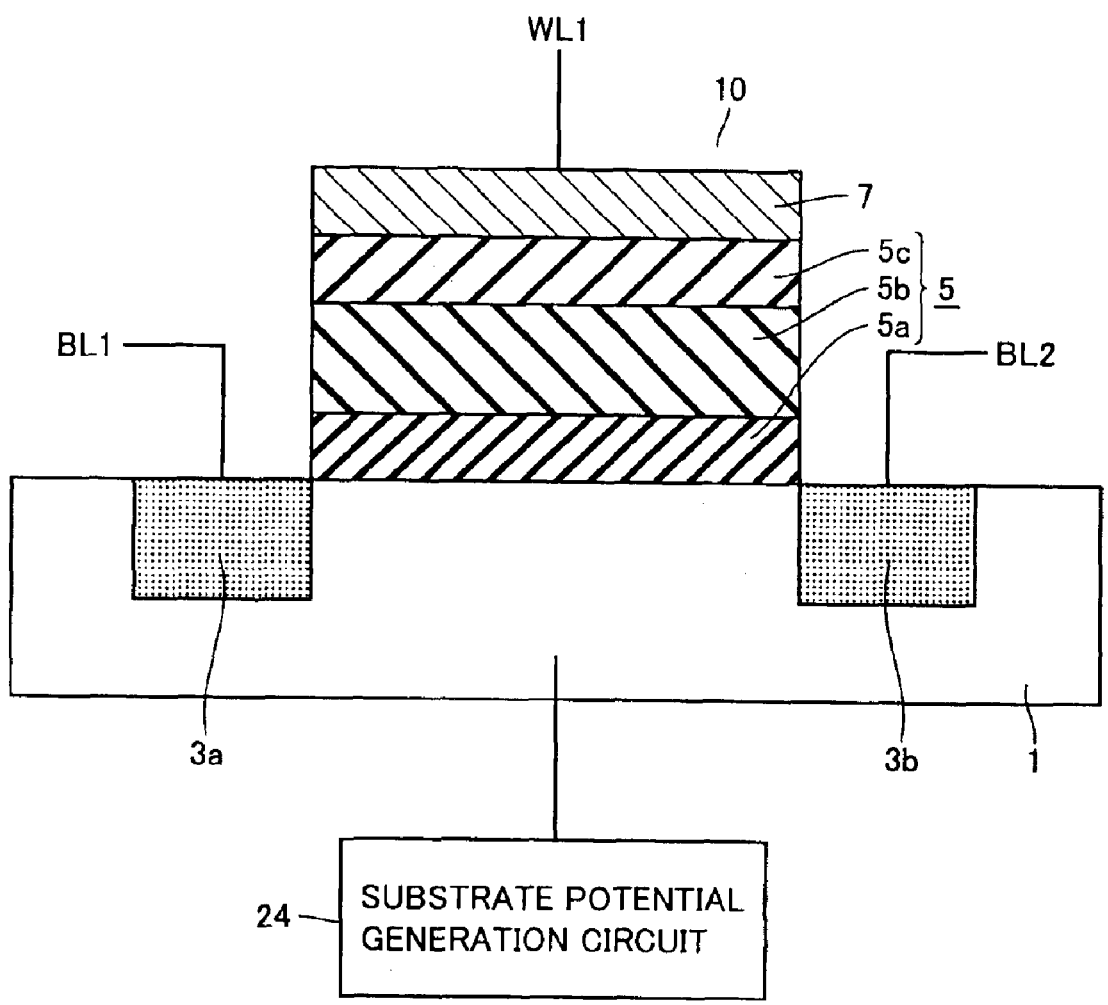
FIG. 3 is a partial cross section of a cell in the non-volatile semiconductor memory device shown in FIG. 1 in the first embodiment.

A structure of one cell 10 will now be described. As shown in FIG. 3, an ONO film 5 formed of a silicon oxide film 5a, a silicon nitride film 5b and a silicon oxide film 5c is formed on a surface of a semiconductor substrate 1. Substrate potential generation circuit 24 is connected to semiconductor substrate 1.

ONO film 5 has a floating gate structure. Of three films constituting ONO film 5, silicon nitride film 5b serves as a floating gate. On ONO film 5, a control gate electrode 7 of, for example, polysilicon or the like is formed. Control gate electrode 7 is connected to a word line WL1.

A pair of impurity regions 3a and 3b as a source/drain region is formed in one region and the other region of semiconductor substrate 1 with ONO film 5 interposed therebetween. Of the pair of impurity regions 3a and 3b, one impurity region 3a is connected to a bit line BL1 and the other impurity region 3b is connected to a bit line BL2.

Figure 4:
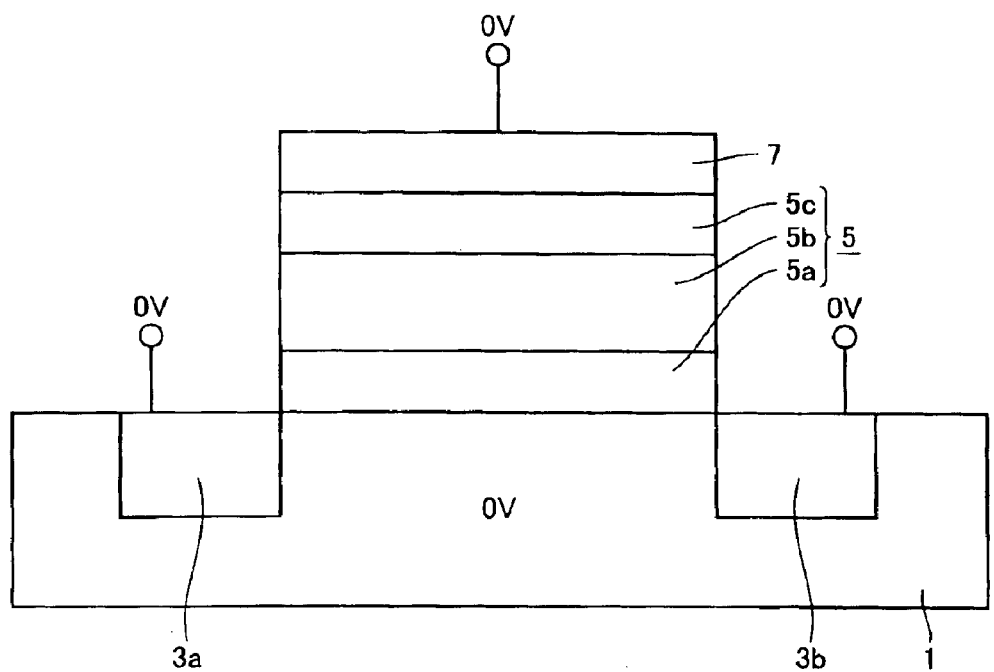
FIGS. 4 to 9 are first to sixth cross sections illustrating a writing operation in the non-volatile semiconductor memory device in the first embodiment.

First, a writing operation as the cell operation will now be described. It is assumed that a selected cell is cell 10 shown in FIG. 2. As shown in FIG. 4, in the initial state, information is not written and a potential of 0V is applied to control gate electrode 7 of the cell, a pair of impurity regions 3a and 3b, and semiconductor substrate 1, respectively.

Switching transistors S1 and S2 are switched on by bit line select circuit 23. BL1 on the left side of cell 10 is connected to a bit line MBL1 and bit line BL2 on the right side is connected to a bit line MBL2.

Then, word line WL is selected by word line select circuit 25, and control gate electrode 7 of cell 10 is connected to word line potential generation circuit 26.

Figure 5:
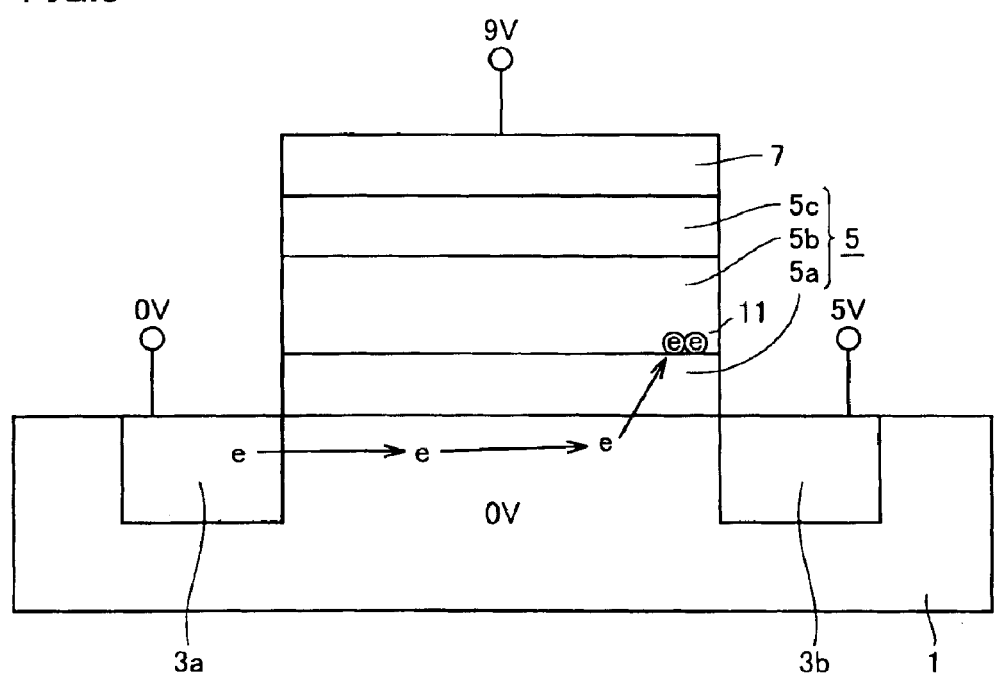

Accordingly, as shown in FIG. 5, a potential of 9V, for example, is applied to control gate electrode 7. A potential of 0V is applied to impurity region 3a and a potential of 5V is applied to impurity region 3b.

Here, electrons flow from impurity region 3a to impurity region 3b, and electron 11 that has become a channel hot electron in the vicinity of impurity region 3b is injected into silicon nitride film 5b in ONO film 5. Thereafter, as shown in FIG. 6, a potential of 0V is applied to control gate electrode 7 of the cell, a pair of impurity regions 3a and 3b and semiconductor substrate 1, respectively.

Figure 6:
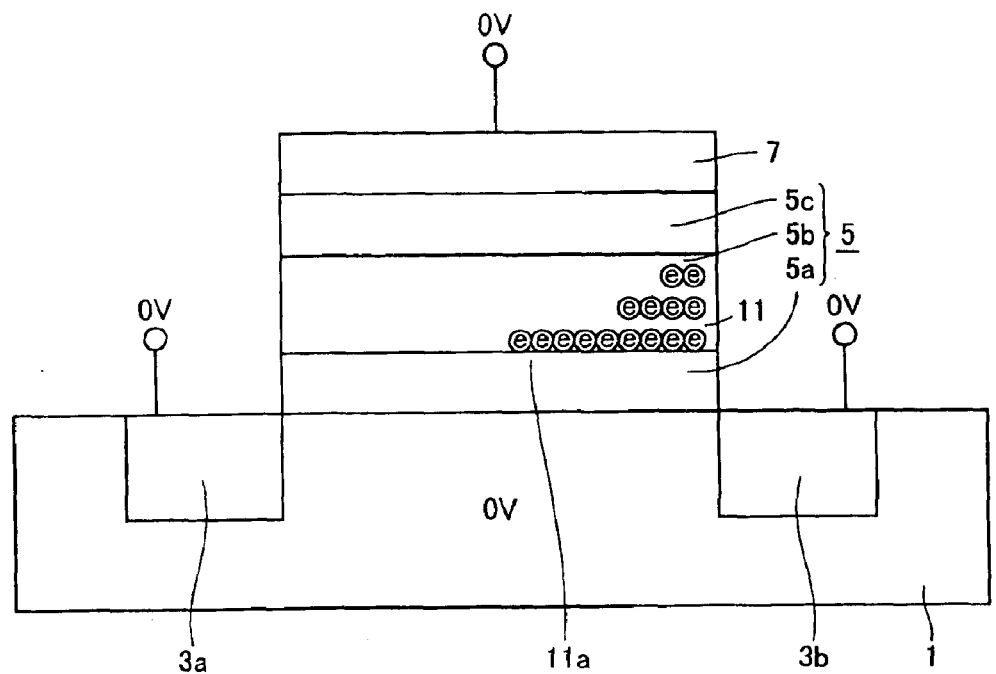

In the state as shown in FIG. 6, electron 11 injected on the impurity region 3b side in silicon nitride film 5b does not move toward the impurity region 3a side. One-bit information is thus written in one cell 10.

Figure 7:
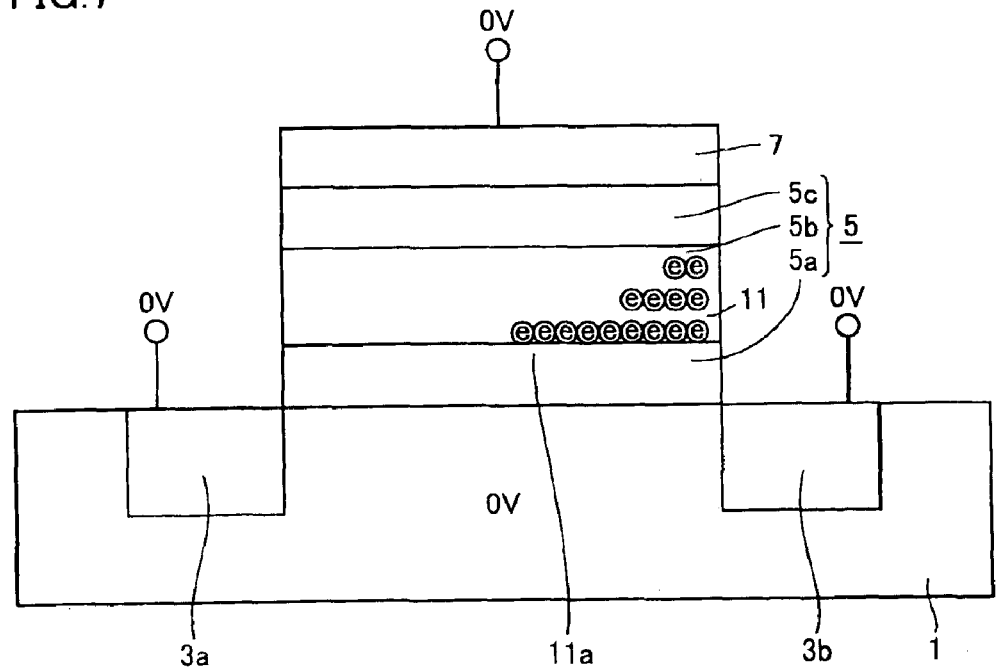

The operation of writing further one-bit information in one cell 10 will be described. In the state in which one-bit information is written as shown in FIG. 7 (the same state as FIG. 6), in a manner similar to the operation described above, bit line BL1 on the left side of cell 10 is connected to bit line MBL1 and bit line BL2 on the right side is connected to bit line MBL2 by bit line select circuit 23.

Then, control gate electrode 7 is connected to word line potential generation circuit 26 by word line select circuit 25.

Figure 8:
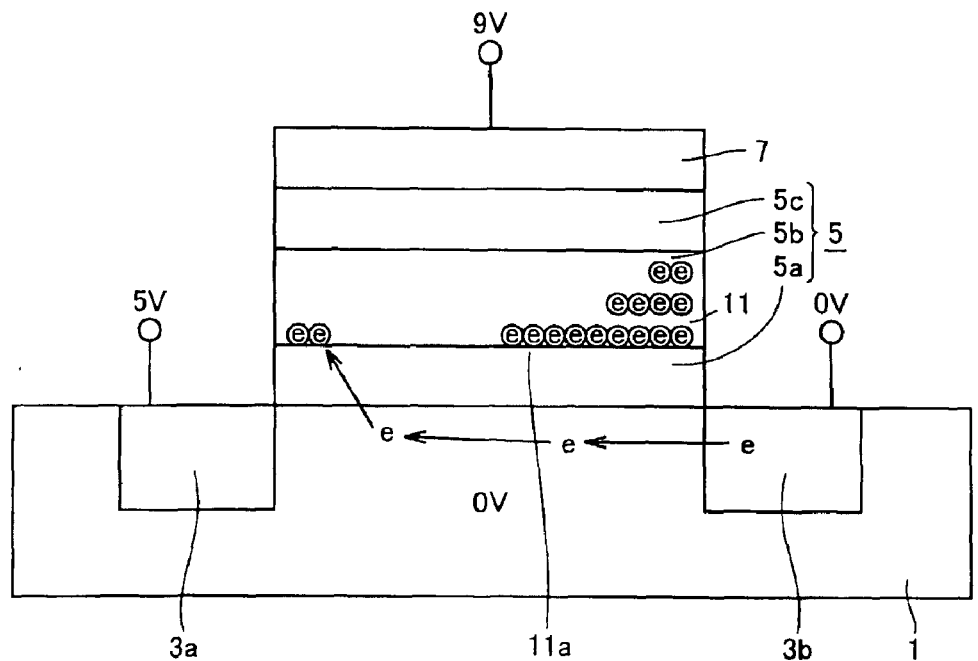

Then, as shown in FIG. 8, for example a potential of 9V is applied to control gate electrode 7. A potential of 5V is applied to impurity region 3a and a potential of 0V is applied to impurity region 3b.

Here, electrons flow from impurity region 3b to impurity region 3a, and electrons that have become channel hot electrons in the vicinity of impurity region 3a are injected into silicon nitride film 5b in ONO film 5. Thereafter, as shown in FIG. 9, a potential of 0V is applied to control gate electrode 7 of the cell, a pair of impurity regions 3a and 3b and semiconductor substrate 1, respectively.

Figure 9:
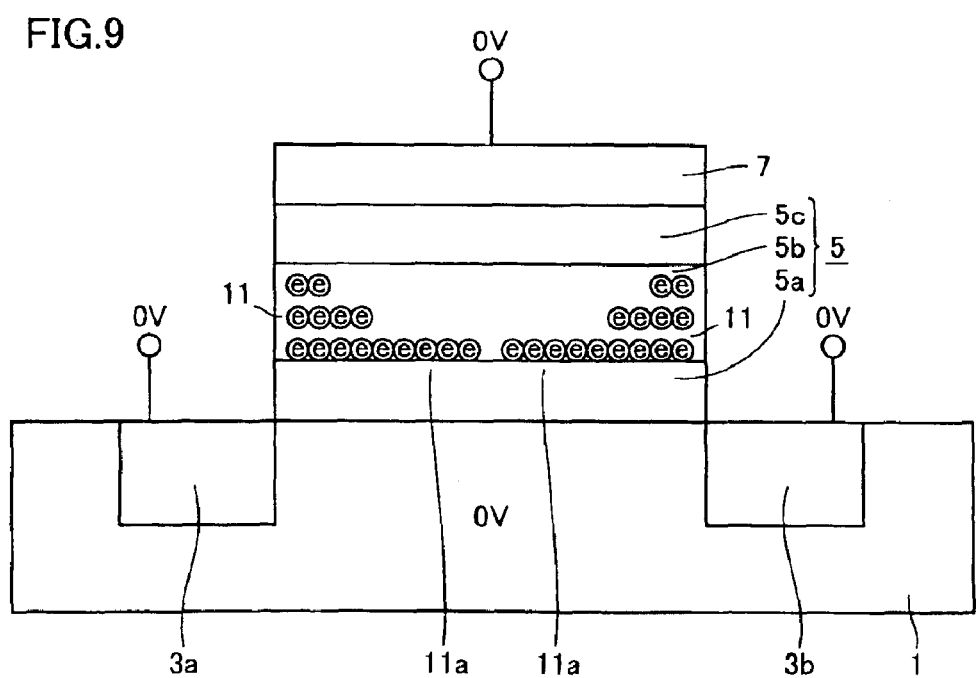

In the state shown in FIG. 9, electrons injected into the impurity region 3a side in silicon nitride film 5b do not move toward the impurity region 3b side. In this way, two-bit information is written in one cell 10.

In such an writing operation, electron (MPE) 11a may be trapped accidentally in that portion of silicon nitride film 5b which is positioned immediately above a region approximately at the middle point between one impurity region 3a and the other impurity region 3b.

As an erasing operation, the operation of erasing information without causing MPE 11a will now be described. In this erasing operation, the erasing operation is performed in a state in which two-bit information is written in one cell 10.

Therefore, if the written information is one bit, information is written for the remaining one bit in order to bring about a state in which two-bit information is written.

As shown in FIG. 6, for example, when electrons 11 as information are accumulated on the impurity region 3b side in one cell 10, electrons 11 as information are also accumulated on the impurity region 3a side in a way shown in FIGS. 7 to 9.

In one cell 10, when electrons as information are initially accumulated on the impurity region 3a side, electrons as information are accumulated also on the impurity region 3b side in a similar manner.

Figure 10:
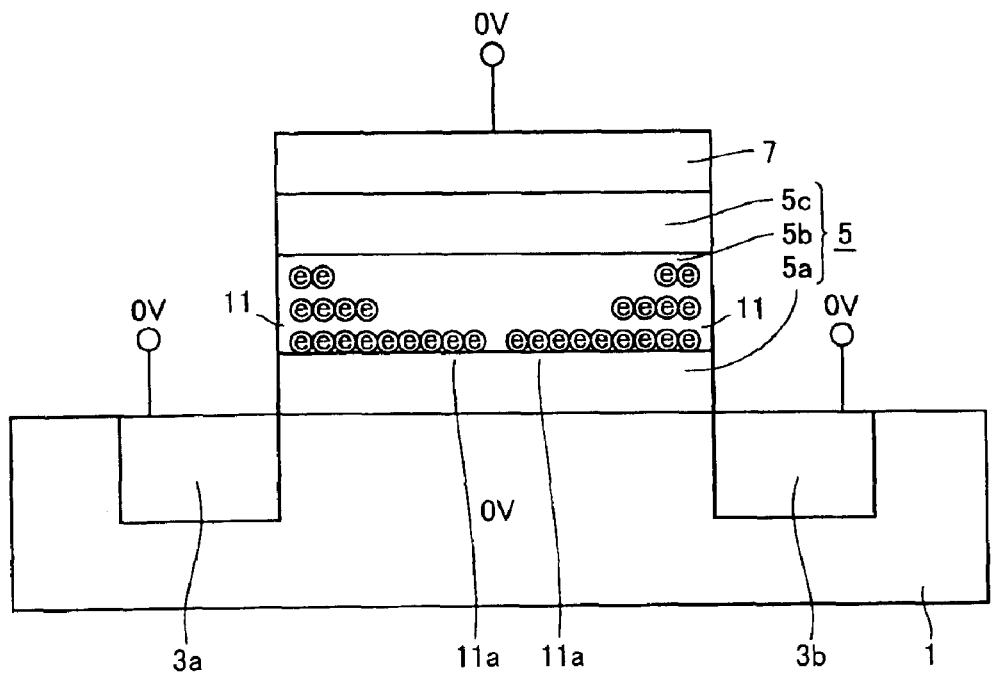
FIGS. 10 to 12 are first to third cross sections illustrating an erasing operation in the non-volatile semiconductor memory device in the first embodiment.

In this way, as shown in FIG. 10, two-bit information is written. It is noted that electrons corresponding to two-bit information are accumulated in silicon nitride film 5b in order to prevent any inconvenience resulting from an over-erasing state in the cell portion corresponding to the portion not written.

In this state, a potential of 0V is applied to control gate electrode 7 of the cell, a pair of impurity regions 3a and 3b and semiconductor substrate 1, respectively.

Then, bit line BL1 on the left side of cell 10 is connected to bit line MBL1 and bit line BL2 on the right side is connected to bit line MBL2 by bit line select circuit 23.

Then, word line WL1 is selected by word line select circuit 25, and control gate electrode 7 of cell 10 is connected to word line potential generation circuit 26.

Figure 11:
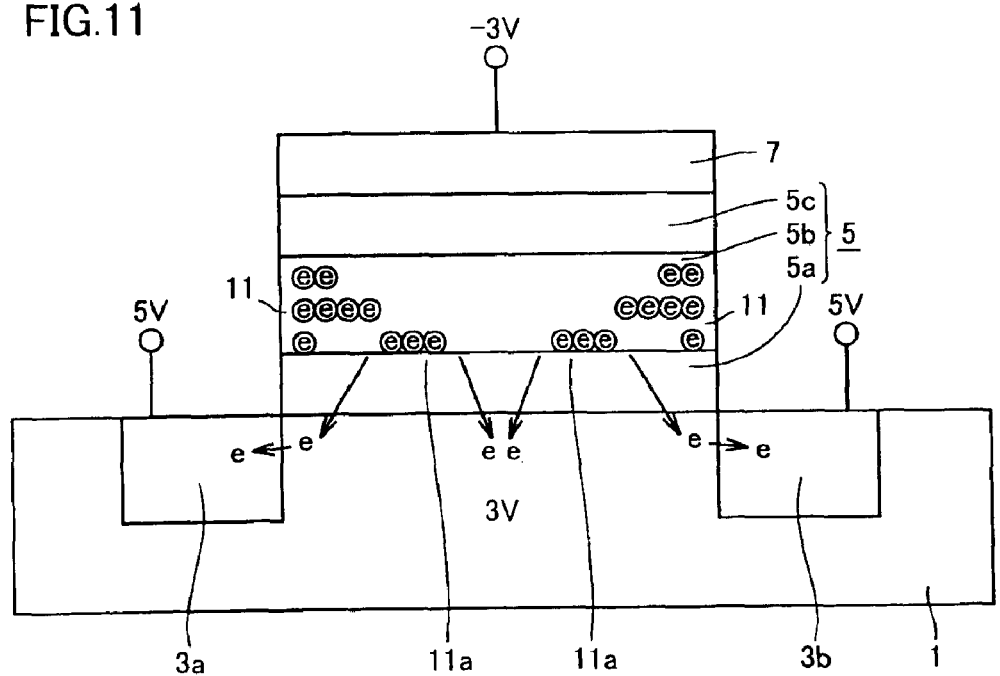

Then, as shown in FIG. 11, for example a potential of −3V is applied to control gate electrode 7. A potential of 5V is applied to a pair of impurity regions 3a and 3b. A potential of 3V is applied to semiconductor substrate 1.

Therefore, as shown in FIG. 11, electrons 11 existing on the impurity region 3a side in silicon nitride film 5b move toward impurity region 3a. Electrons 11 existing on the impurity region 3b side move toward impurity region 3b side.

Electrons 11a existing in that part (middle part) of silicon nitride film 5b which is positioned immediately above a region at the middle point between one impurity region 3a and the other impurity region 3b move toward semiconductor substrate 1.

This is because in the middle part of silicon nitride film 5b an electric field is created in a direction in which electrons 11a are pulled off from control gate electrode 7 toward semiconductor substrate 1, and electrons 11a existing in the middle part of silicon nitride film 5b is easily drawn to semiconductor substrate 1 by setting semiconductor substrate 1 to a positive potential that draws electrons 11a.

Figure 12:
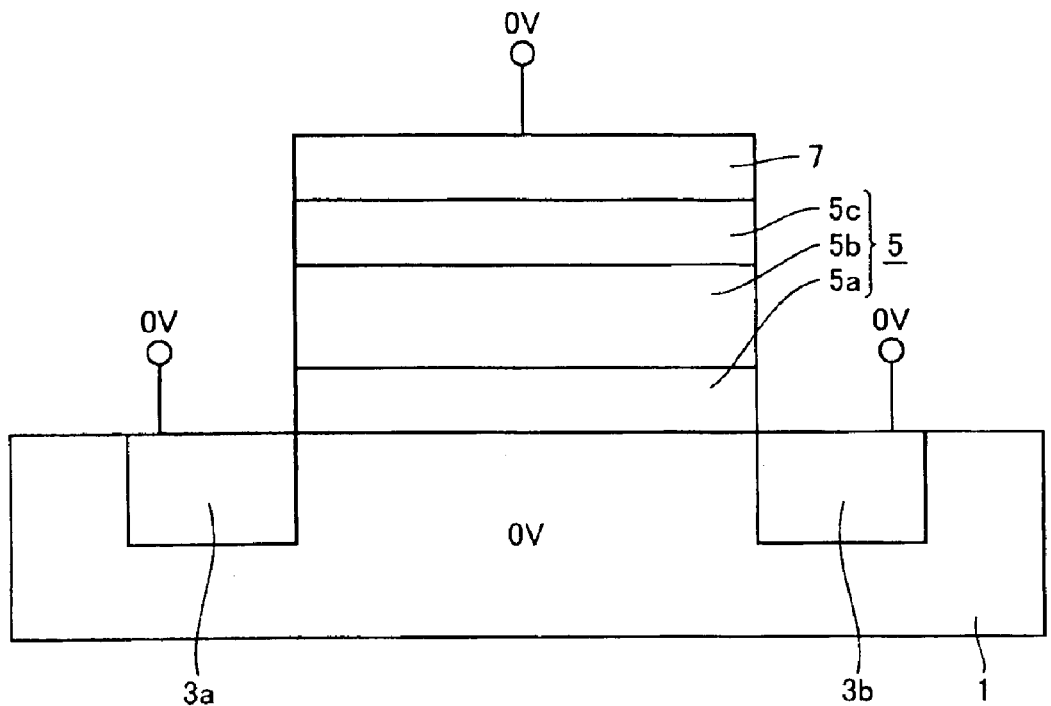

In this manner, as shown in FIG. 12, all electrons 11, 11a accumulated in silicon nitride film 5b are pulled off, thereby completing the information erasing operation.

In accordance with the erasing method as described above, the respective prescribe potentials are applied to control gate electrode 7, a pair of impurity regions 3a and 3b and semiconductor substrate 1 so that electrons 11, 11a accumulated in silicon nitride film 5b are simultaneously pulled off in three directions toward both of a pair of the impurity regions 3a and 3b and the semiconductor substrate.

Figure 13:
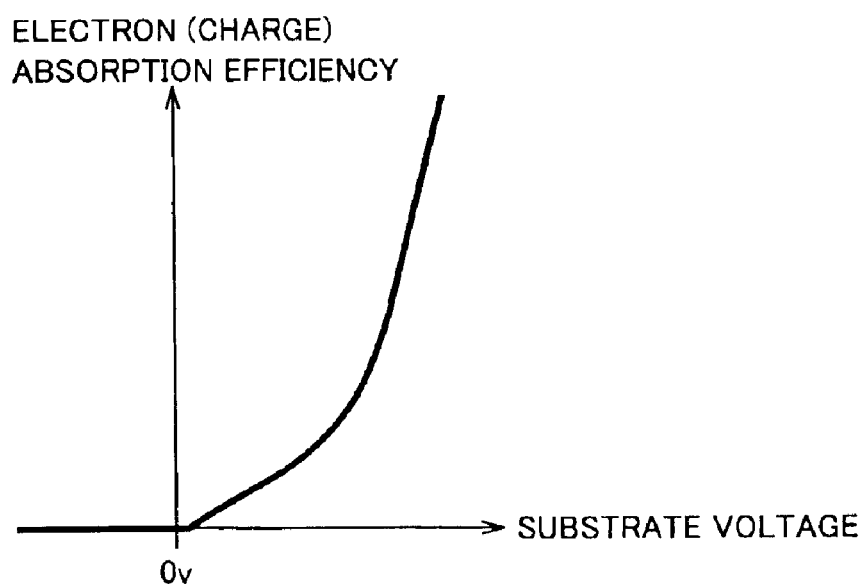
FIG. 13 is a graph showing the relation between a potential applied to a semiconductor substrate and an electron absorption rate in the first embodiment.

Particularly, as shown in FIG. 13, the higher the potential (voltage) applied to semiconductor substrate 1 is, the higher the ratio of electrons absorbed into the semiconductor substrate (electron absorption rate) is. Therefore, the electrons that are driven out by a negative potential applied to control gate electrode 7 are easily drawn to semiconductor substrate 1.

Therefore all electrons 11, 11a in silicon nitride film 5b are simultaneously pulled off from silicon nitride film 5b in a single erasing operation. As a result, electrons 11a no longer remain in silicon nitride film 5b as MPE after the erasing operation, so that the threshold voltage variations in the cell resulting from the existence of MPE can be prevented.

Furthermore, all electrons accumulated in silicon nitride film 5b are pulled off in a single erasing operation even without setting a cycle specifically for pulling off electron 11a, so that the erasing time can be reduced.

It is noted that though in the embodiment described above it has been described by way of example that a potential of −3V is applied to control gate electrode 7, a potential of 5V is applied to a pair of impurity regions 3a and 3b, and a potential of 3V is applied to semiconductor substrate 1, the present invention may not be limited to the potential described above as long as it allows electrons 11, 11a accumulated in silicon nitride film 5b to be simultaneously pulled off in three directions toward both of a pair of impurity regions 3a and 3b and the semiconductor substrate.

Second Embodiment

In the case of the non-volatile semiconductor memory device as described above, it has been described by way of example that a positive potential is applied to semiconductor substrate 1 in the erasing operation. In some non-volatile semiconductor memory devices, it may be difficult to apply a positive potential to the semiconductor substrate.

In a second embodiment of the present invention, an erasing operation in the non-volatile semiconductor memory device where it is difficult to apply a positive potential to such a semiconductor substrate will be described. In the non-volatile semiconductor memory device, a semiconductor substrate is provided with a memory cell region formed with a plurality of cells shown in FIG. 1 and a peripheral circuit region formed with a prescribed circuit for writing, erasing or the like of information for each cell.

In a twin well structure rather than a triple well structure as a well structure, the memory cell region and the peripheral circuit region are not electrically separated and therefore it is difficult to apply a positive potential to the entire semiconductor substrate. In such a case, such an erasing method is effective in that electrons accumulated in the silicon nitride film are pulled off toward the control gate electrode.

Figure 14:
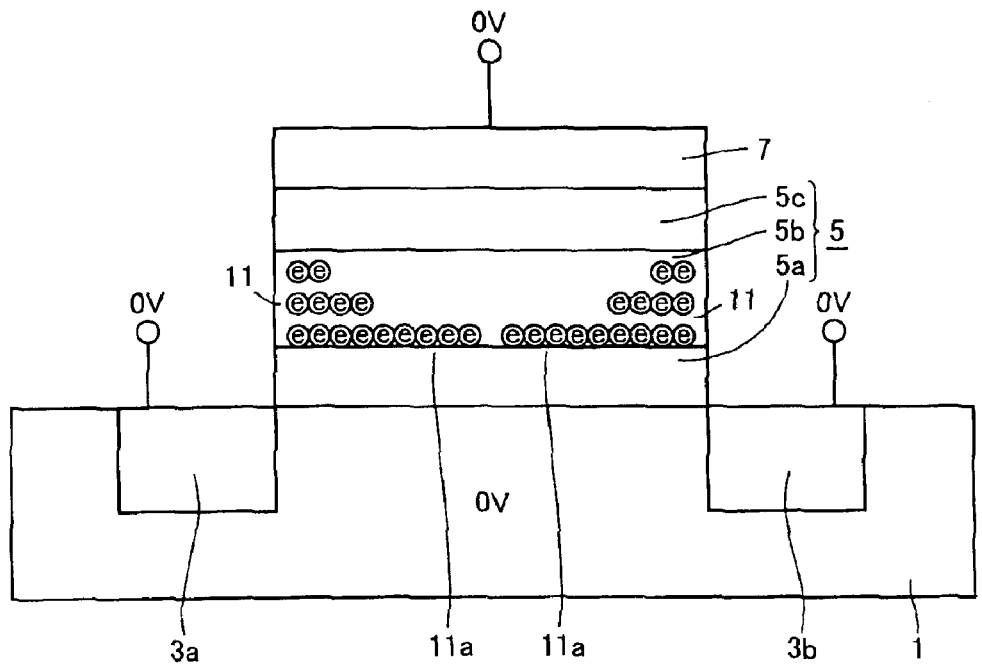
FIGS. 14 to 16 are first to third cross sections illustrating an erasing operation of the non-volatile semiconductor memory device in accordance with a second embodiment of the present invention.

It is noted that also in this case the erasing operation is performed in a state in which two-bit information is written in one cell as shown in FIG. 14, for the reason as described above. Therefore if written information is one bit, information is written for the remaining one bit in order to bring about a state in which two-bit information is written.

In this way, after two-bit information is written in one cell, bit line BL1 is connected to bit line MBL1 and bit line BL2 is connected to bit line MBL2 by bit line select circuit 23.

Then, word line WL1 is selected by word line select circuit 25, and control gate electrode 7 of cell 10 is connected to word line potential generation circuit 26.

Figure 15:
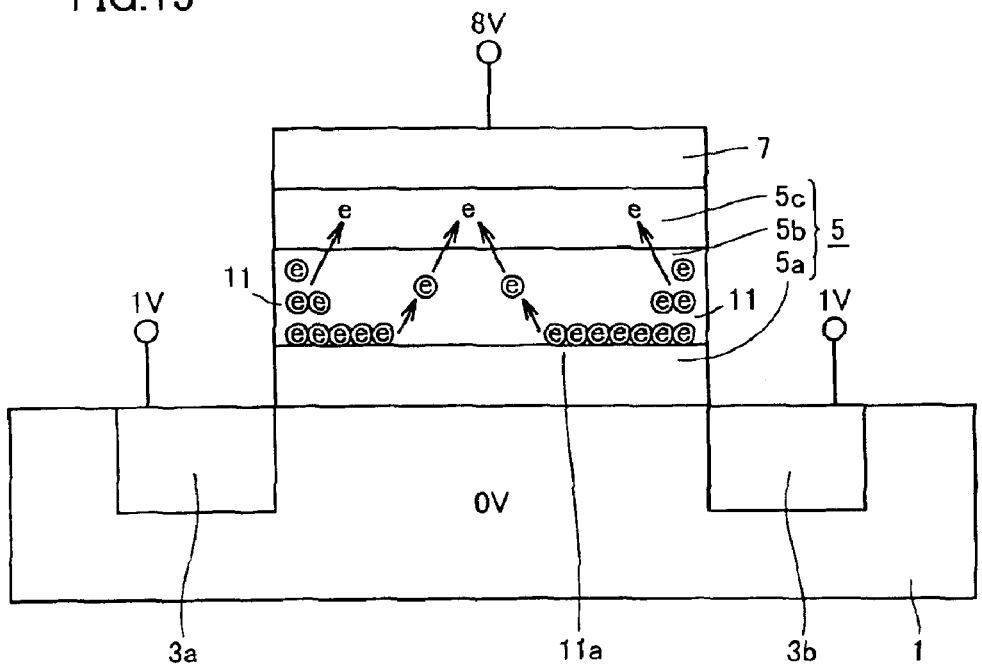

Then, as shown in FIG. 15, for example a potential of 8V is applied to control gate electrode 7. A potential of 1V is applied to a pair of impurity regions 3a and 3b. A potential of 0V is applied to semiconductor substrate 1.

Therefore, electrons 11 existing on the respective sides of impurity regions 3a and 3b in silicon nitride film 5b move toward control gate electrode 7. Then electrons 11a existing at the middle part of silicon nitride film 5b also move toward control gate electrode 7.

Here, PN junction bias is −1V between impurity region pair 3a, 3b and semiconductor substrate 1 in a reverse bias state, and an electric field (bias) is created in the entire ONO film 5 in a direction in which electrons are moved toward control gate electrode 7. As a result, all electrons 11, 11a accumulated in silicon nitride film 5b are easily drawn to control gate electrode 7 at one time.

Figure 16:
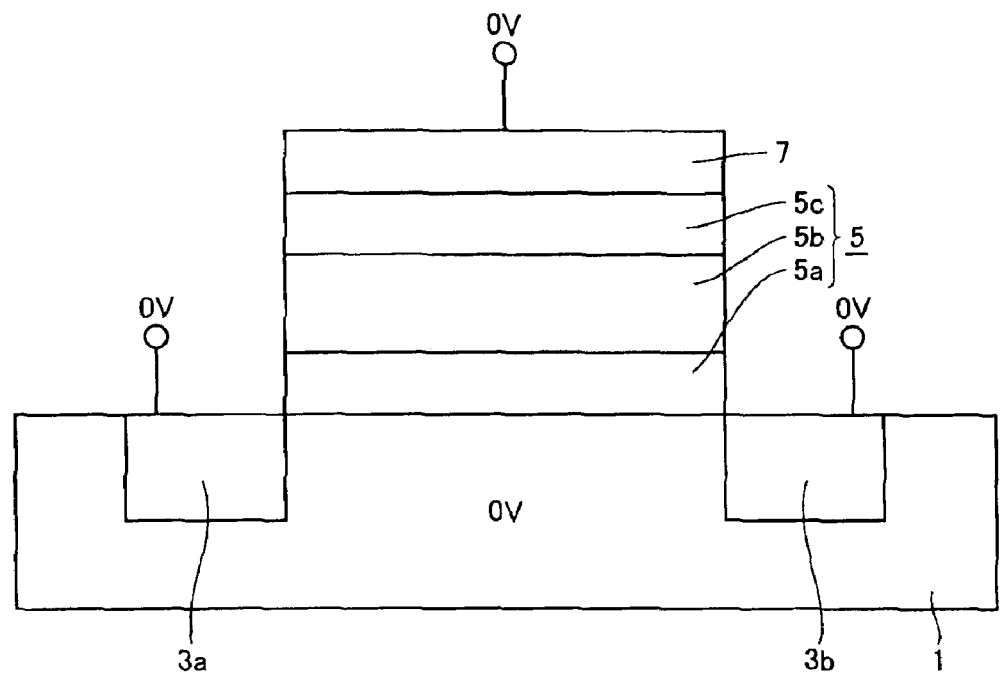
Figure 17:
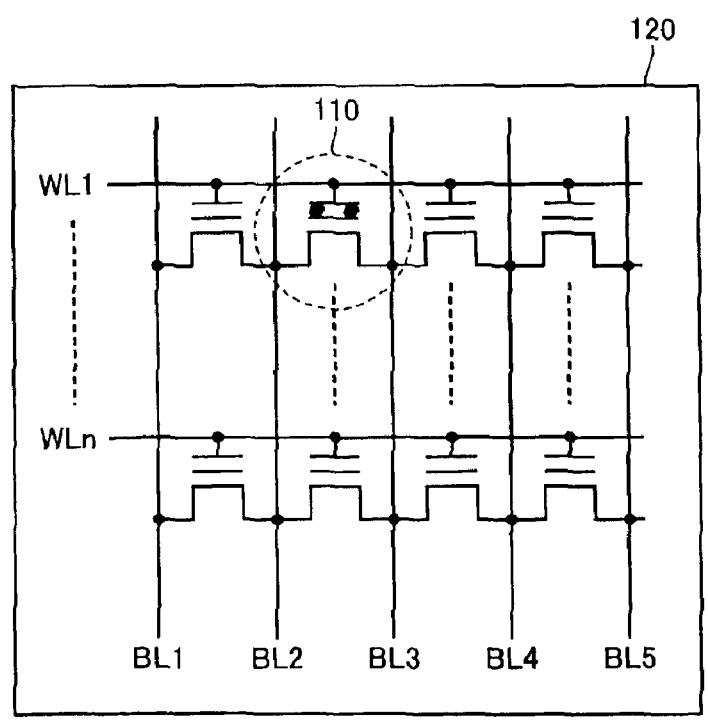
FIG. 17 illustrates a cell structure in a conventional non-volatile semiconductor memory device.
Figure 18:
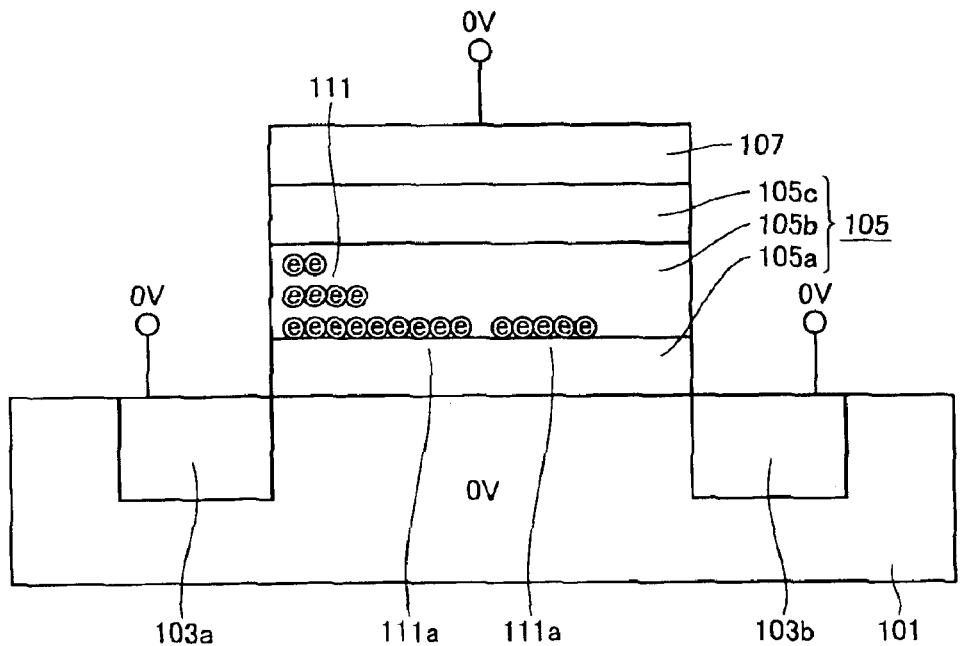
FIGS. 18 to 26 are first to ninth cross sections illustrating an erasing operation of the conventional non-volatile semiconductor memory device.
Figure 19:
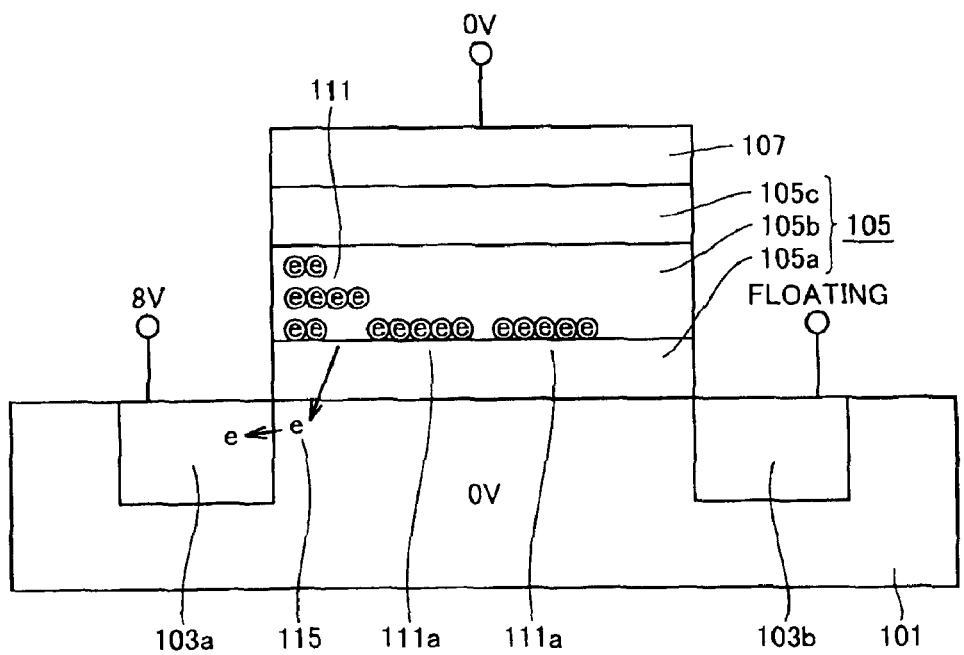
Figure 20:
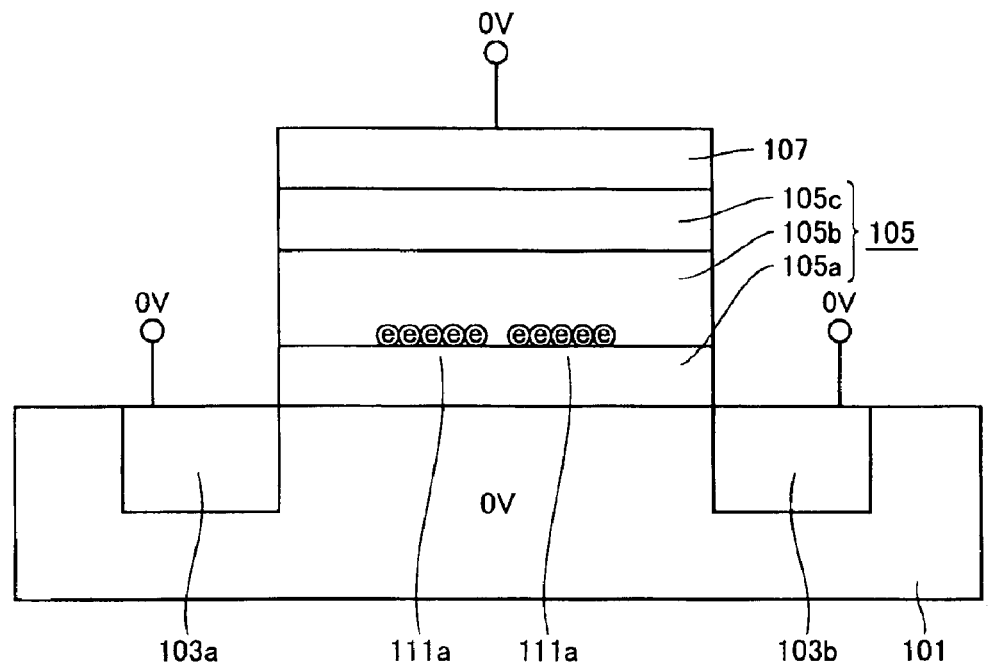
Figure 21:
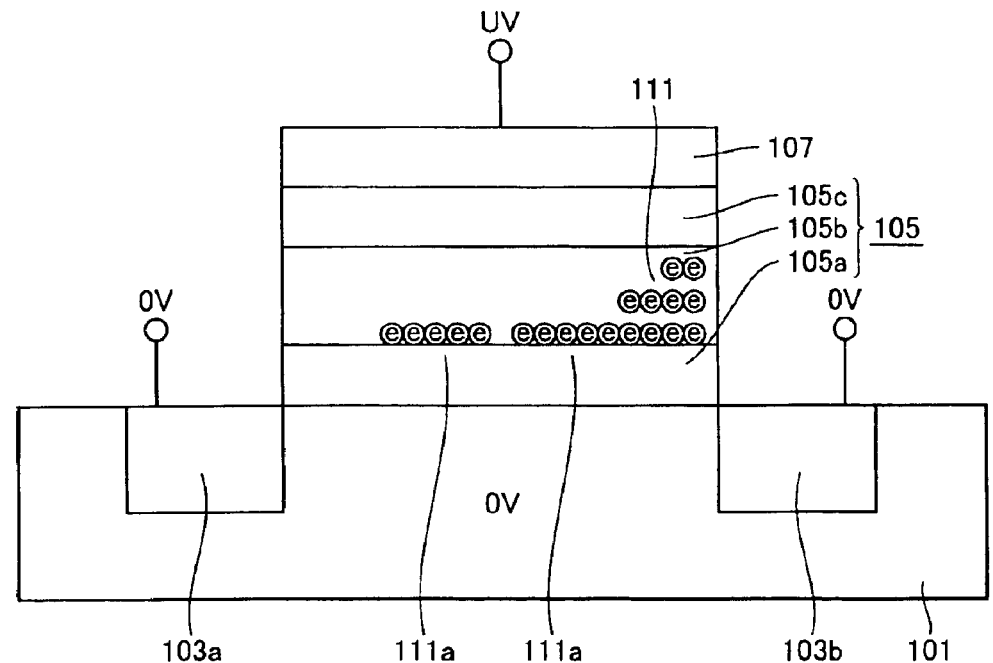
Figure 22:
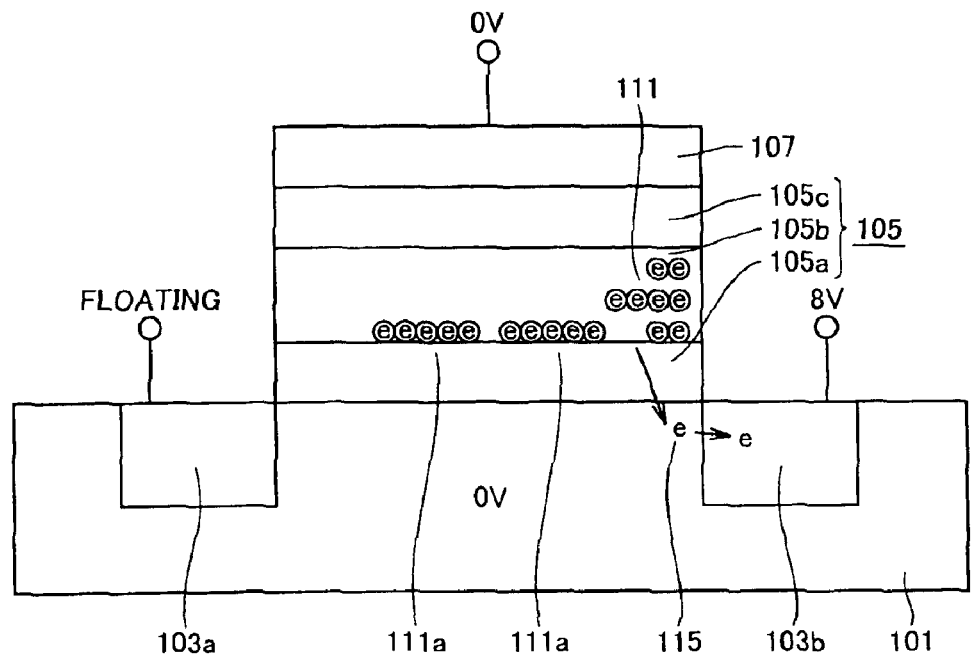
Figure 23:
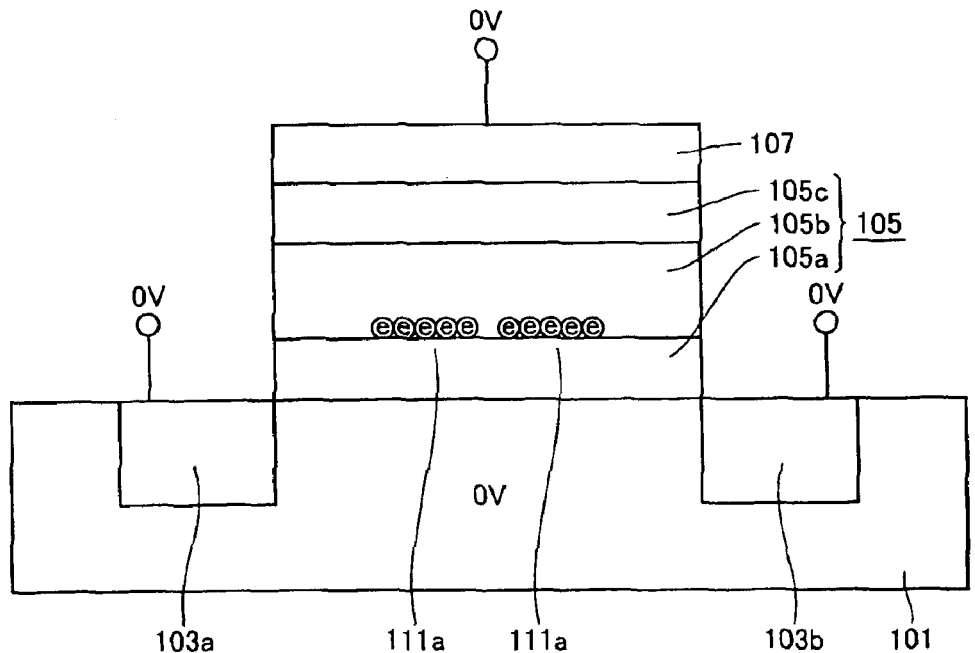
Figure 24:
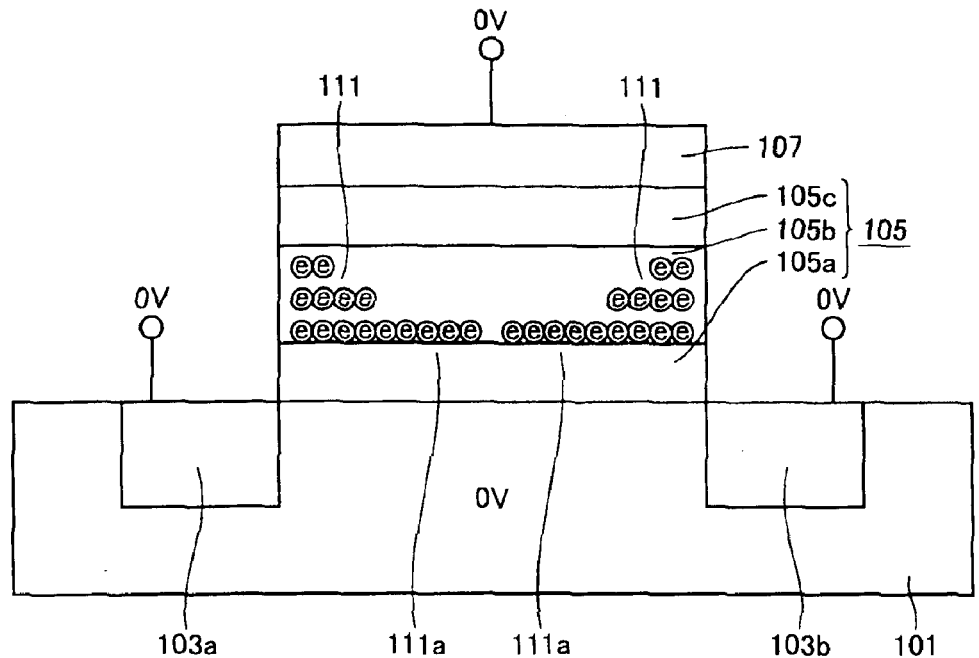
Figure 25:
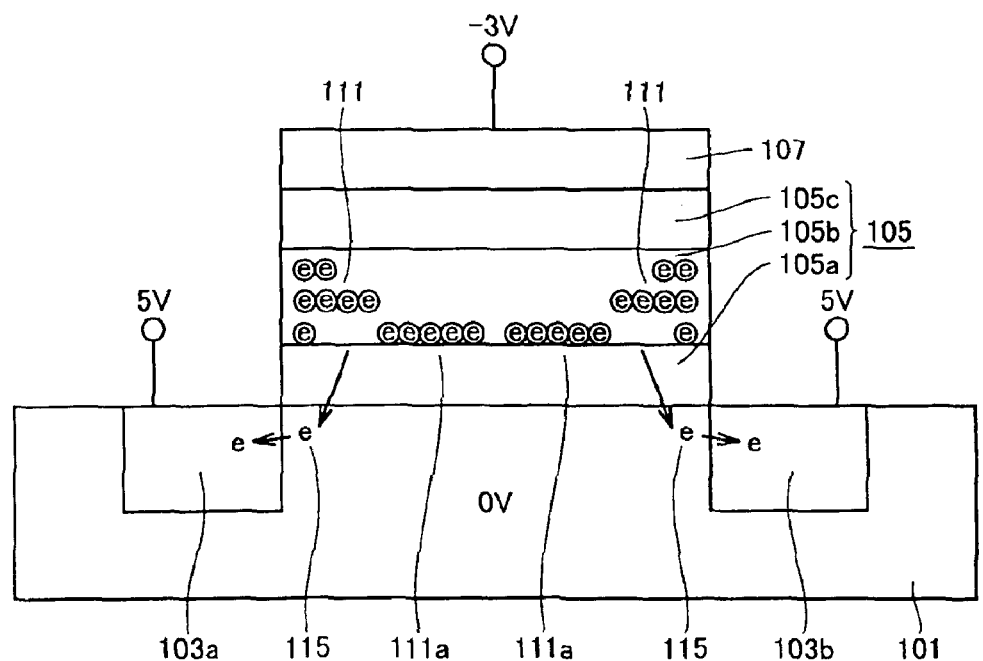
Figure 26:
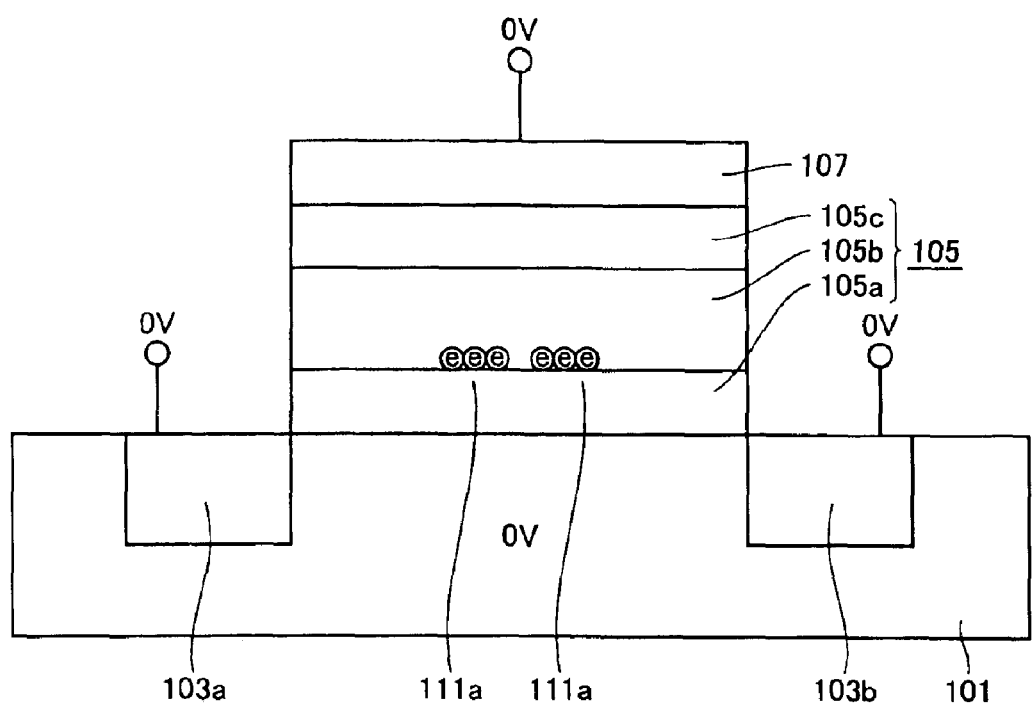

In this manner, as shown in FIG. 16, all the electrons accumulated in silicon nitride film 5b are pulled off to control gate electrode 7, thereby completing the information erasing operation.

In accordance with the erasing operation as described above, the respective prescribed potentials are applied to control gate electrode 7, a pair of impurity regions 3a and 3b and semiconductor substrate 1 so that the electrons accumulated in silicon nitride film 5b are simultaneously pulled off toward control gate electrode 7.

Therefore, all electrons 11, 11a existing in silicon nitride film 5b are simultaneously pulled off from silicon nitride film 5b toward control gate electrode 7 in a single erasing operation. As a result, electrons 11a no longer remain in silicon nitride film 5b as MPE after the erasing operation, so that the threshold voltage variations in cell 10 resulting from the existence of MPE can be prevented.

Furthermore, all electrons 11, 11a accumulated in silicon nitride film 5b are pulled off in a single erasing operation even without setting a cycle specifically for pulling off electron 11a, so that the erasing time can be reduced.

It is noted that though in the embodiment described above it has been described by way of example that a potential of 8V is applied to control gate electrode 7, a potential of 1V is applied to a pair of impurity regions 3a and 3b, and a potential of 0V is applied to semiconductor substrate 1 in erasing information, the present invention may not be limited to the potential described above as long as it allows electrons 11, 11a accumulated in silicon nitride film 5b to be pulled off toward control gate electrode 7.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of erasing information in a non-volatile semiconductor memory device including:

a pair of impurity regions formed spaced apart from each other on a main surface of a semiconductor substrate;

an insulating film including a charge accumulation layer formed on a region of said semiconductor substrate which is sandwiched between said pair of impurity regions for accumulating charges; and an electrode portion formed on said insulating film for controlling movement of charges for said charge accumulation layer, wherein said erasing method is carried out by applying a positive potential to the pair of impurity regions and the semiconductor substrate, respectively, as a prescribed potential for simultaneously pulling off charges accumulated in said charge accumulation layer in three directions toward both of said pair of impurity regions and said semiconductor substrate.

2. The method of erasing information in a non-volatile semiconductor memory device according to claim 1, wherein in said prescribed potential, a third potential<a first potential<a second potential, and 0V<the first potential, where the first potential is a potential to be applied to said semiconductor substrate, the second potential is a potential to be applied to said pair of impurity regions and the third potential is a potential to be applied to said electrode portion.

3. The method of erasing information in a non-volatile semiconductor memory device according to claim 1, wherein said prescribed potential is applied in a state in which charges corresponding to two bits are accumulated in said charge accumulation layer.

4. A method of erasing information in a non-volatile semiconductor memory device including:

a pair of impurity regions formed spaced apart from each other on a main surface of a semiconductor substrate;

an insulating film including a charge accumulation layer formed on a region of said semiconductor substrate which is sandwiched between said pair of impurity regions; and an electrode portion formed on said insulating film for controlling movement of charges for said charge accumulation layer, wherein said erasing method is carried out by applying a positive voltage to the electrode portion as a prescribed potential for pulling off charges accumulated in said charge accumulation layer toward said electrode portion.

5. The method of erasing information in a non-volatile semiconductor memory device according to claim 4, wherein in said prescribed potential, a first potential<a second potential<a third potential, where the first potential is a potential to be applied to said semiconductor substrate, the second potential is a potential to be applied to said pair of impurity regions, and the third potential is a potential to be applied to said electrode portion.

* * * * *